(12) United States Patent
Wang et al.

(10) Patent No.: US 12,295,177 B2
(45) Date of Patent: May 6, 2025

(54) METHOD FOR PREPARING PIXEL CELL OF CMOS IMAGE SENSOR

(71) Applicant: Shanghai Huali Microelectronics Corporation, Shanghai (CN)

(72) Inventors: Lu Wang, Shanghai (CN); Cuiyu Mei, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 525 days.

(21) Appl. No.: 17/890,376

(22) Filed: Aug. 18, 2022

(65) Prior Publication Data

US 2023/0073606 A1   Mar. 9, 2023

(30) Foreign Application Priority Data

Sep. 8, 2021 (CN) .......................... 202111050256.X

(51) Int. Cl.
*H10F 39/00* (2025.01)
*H04N 25/75* (2023.01)
*H04N 25/77* (2023.01)

(52) U.S. Cl.
CPC ........... *H10F 39/014* (2025.01); *H04N 25/75* (2023.01); *H04N 25/77* (2023.01)

(58) Field of Classification Search
CPC ... H10F 39/014; H10F 39/8033; H04N 25/75; H04N 25/77; Y02P 70/50
See application file for complete search history.

(56) References Cited

U.S. PATENT DOCUMENTS

| | | | | |
|---|---|---|---|---|
| 10,700,225 | B2* | 6/2020 | Wang | H10F 71/121 |
| 2012/0094419 | A1* | 4/2012 | Lim | H10F 39/014 |
| | | | | 438/57 |
| 2015/0349001 | A1* | 12/2015 | Wang | H10F 39/014 |
| | | | | 257/443 |
| 2017/0345852 | A1* | 11/2017 | Lee | H10F 39/18 |
| 2024/0321931 | A1* | 9/2024 | Zhou | H10F 39/014 |

* cited by examiner

*Primary Examiner* — Jeff W Natalini
*Assistant Examiner* — Nicholas Leland Hutson
(74) *Attorney, Agent, or Firm* — Banner & Witcoff, Ltd.

(57) ABSTRACT

The present application discloses a method for preparing a pixel cell of a CMOS image sensor. Process optimization and adjustment for multiple times of ion implantation in a pixel area of the CMOS image sensor are carried out. That is, photodiode N-type ion implantation is performed before formation of a polysilicon gate of each MOS transistor of a CMOS pixel readout circuit, a photoresist open area is enlarged by means of a photoresist dry etching descum process such that an N-type ion implantation area is enlarged, and second photodiode N-type ion implantation is performed on the basis of the photoresist dry etching descum process, so as to achieve two times of photodiode N-type ion implantation using the same mask, with different depths and different pattern sizes, thereby forming an N-type area of the photodiode that tapers to the bottom, saving a mask layer, and reducing photolithography steps.

7 Claims, 3 Drawing Sheets

METHOD FOR PREPARING PIXEL CELL OF CMOS IMAGE SENSOR

CROSS-REFERENCES TO RELATED APPLICATIONS

This application claims the priority to Chinese patent application No. 202111050256.X, filed on Sep. 8, 2021, the disclosure of which is incorporated herein by reference in its entirety.

TECHNICAL FIELD

The present application relates to the semiconductor manufacturing technology, in particular to a method for preparing a pixel cell of a CMOS image sensor.

BACKGROUND

The CMOS image sensor (CIS) is increasingly used year by year due to the compatibility between the manufacturing process thereof and the existing integrated circuit manufacturing process and the performance thereof having much advantages compared to the original charge coupled device (CCD). A driving circuit and a pixel can be integrated together in the CMOS image sensor. Since an electrical signal can be output during collection of an optical signal, image information can be processed in real time, with a speed much faster than that of the CCD image sensor. The CMOS image sensor also has many advantages such as a low price, a relatively large bandwidth, the anti-blur capability, access flexibility, and a relatively large fill factor.

The CMOS image sensor is composed of a pixel cell circuit and a CMOS circuit. The pixel cell circuit is located in a pixel area, and the CMOS circuit is a logic circuit located in a logic area. Compared with the CCD image sensor, the CMOS image sensor has a higher level of integration due to the CMOS standard manufacturing process, can be integrated with other digital-analog operation and control circuits on the same chip, and thus is more applicable to the future development. According to the number of transistors included in the pixel cell circuit, the existing CMOS image sensor is mainly classified into a 3T-type structure and a 4T-type structure.

FIG. 1 is a schematic diagram of an equivalent circuit of a pixel cell circuit of an existing 3T-type CMOS image sensor. The pixel cell circuit of the existing 3T-type CMOS image sensor includes a photodiode (PD) D1 and a CMOS pixel readout circuit. The CMOS pixel readout circuit is a 3T-type pixel circuit, including a reset transistor M1, an amplification transistor M2, and a selection transistor M3, all of which are NMOS transistors. An N-type area of the photodiode D1 is connected to the source of the reset transistor M1.

The gate of the reset transistor M1 is connected to a reset signal Reset, and the reset signal Reset is a potential pulse. When the reset signal Reset is at a high level, the reset transistor M1 is turned on and absorbs electrons of the photodiode D1 into the power supply Vdd of the readout circuit so as to achieve reset. When irradiated by light, the photodiode D1 generates photogenerated electrons, the potential increases, and an electrical signal is output by an amplification circuit. The gate of the selection transistor M3 is connected to a row selection signal Rs, so as to select and output the amplified electrical signal as an output signal Vout.

FIG. 2 is a schematic diagram of an equivalent circuit of a pixel cell circuit of an existing 4T-type CMOS image sensor. The structure shown in FIG. 2 differs from the structure shown in FIG. 1 by including a transfer transistor, which is also referred to as pass transistor M4. The source area of the transfer transistor M4 is an N-type area connected to the photodiode D1, the drain area of the transfer transistor M4 is a floating diffusion (FD) area, and the gate of the transfer transistor M4 is connected to a transfer control signal Tx. After generated by the photodiode D1, the photogenerated electrons are transferred to the floating diffusion area by the transfer transistor M4, and then signal amplification is achieved by connecting the floating diffusion area to the gate of the amplification transistor M2. The photosensitivity of the CIS is significantly related to the size of the pixel area. After the photodiode is reset, the N-type area of the photodiode is substantially depleted, light is absorbed in a depletion area to generate corresponding photogenerated electrons, and the depletion area also serves as a potential well for storing the photogenerated electrons. Therefore, if the depletion area formed by the N-type area of the photodiode is larger, the absorption efficiency and the photosensitivity are higher, and the capacity of the potential well storing the photogenerated electrons, i.e., full well capacity, is larger. Pixel high energy ion implantation (IMP) is usually adopted to obtain a larger N-type area of the photodiode.

The pixel area of the CIS device undertakes the important sensing function of the device and is an important factor that affects the performance of the device. A section of the pixel area of the CIS device is shown in FIG. 3. A process of preparing a pixel area of the existing 55 nm CIS device includes the following steps:

(1) A polysilicon gate 6 of each MOS transistor of a CMOS pixel readout circuit is formed on a semiconductor substrate.

(2) N-type shallow ion implantation of two photodiodes (PDs) on the left side is performed in a selected area of the P-type semiconductor substrate 1 by means of the process methods of photolithography definition and ion implantation, so as to form an N-type shallow doped area 4 of the two photodiodes (PDs) on the left side, wherein an ion implantation angle is 0.5-3 degrees to the right of the vertical direction.

(3) N-type shallow ion implantation of two photodiodes (PDs) on the right side is performed in a selected area of the P-type semiconductor substrate 1 by means of the process methods of photolithography definition and ion implantation, so as to form an N-type shallow doped area 4 of the two photodiodes (PDs) on the right side, wherein an ion implantation angle is 0.5-3 degrees to the left of the vertical direction.

(4) A hard mask (HM) on the polysilicon gate 6 of each MOS transistor of a CMOS pixel readout circuit is removed.

(5) A first spacer layer is deposited.

(6) A second spacer layer is deposited.

(7) The first spacer layer and the second spacer layer are dry-etched.

(8) The first spacer layer and the second spacer layer are wet-etched, so as to form a spacer of the polysilicon gate 6 of each MOS transistor of the CMOS pixel readout circuit.

(9) P-type shallow ion implantation of all the four photodiodes (PDs) is performed in a selected area of the P-type semiconductor substrate 1 by means of the process methods of photolithography definition and ion implantation, so as to form a P-type shallow doped area 5 of the four photodiodes (PDs), wherein the P-type shallow doped area 5 is located on the P-type semiconductor substrate 1 above the N-type shallow doped area 4.

The process of preparing the pixel area of the existing 55 nm CIS device involves multiple levels of ion implantation, so as to satisfy the functions of electron capture, storage, and reading. In order to achieve a gradient change of the N-type shallow doped area 4 that tapers to the bottom, which facilitates charge storage and transfer processes and thus facilitates the improvement in the uniformity of pixel performance, it is necessary to perform secondary N-type shallow ion implantation. There are a plurality of ion implantation layers, and therefore a plurality of photolithography processes are required to define ion implantation patterns and sizes, leading to a complicated preparation process, a long production cycle, a tight production capacity for key machines, and a high cost.

BRIEF SUMMARY

The technical problem to be solved by the present application is to provide a method for preparing a pixel cell of a CMOS image sensor, so as to form an N-type area of a photodiode that tapers to the bottom, save a mask layer, reduce photolithography steps, reduce the cost of manufacturing the CMOS image sensor, and shorten the cycle of manufacturing the CMOS image sensor.

In order to solve the above technical problem, the method for preparing a pixel cell of a CMOS image sensor provided by the present application includes the following steps:

step 1, defining an N-type ion implantation area of a photodiode on a P-type semiconductor substrate (1) by means of photolithography and etching, and performing first photodiode N-type ion implantation;

step 2, performing a photoresist dry etching descum process to increase the size of a photoresist open area, so that the N-type ion implantation area is enlarged, and performing second photodiode N-type ion implantation, wherein the depth of the second photodiode N-type ion implantation is less than the depth of the first photodiode N-type ion implantation;

step 3, removing the photoresist, forming a gate polysilicon layer on the semiconductor substrate, and forming a polysilicon gate 6 of each MOS transistor of a CMOS pixel readout circuit by means of photolithography and etching;

step 4, removing the photoresist, and performing first photodiode P-type ion implantation by using the polysilicon gate 6 as a mask, wherein the depth of the first photodiode P-type ion implantation is less than the depth of the second photodiode N-type ion implantation; and step 5, depositing a spacer oxide layer, and forming a spacer 7 of the polysilicon gate 6 of each MOS transistor of the CMOS pixel readout circuit by means of photolithography and etching.

In an example, firstly, a plurality of P wells 2 are formed on the P-type semiconductor substrate 1 and an N well 3 connecting two adjacent P wells 2 is formed, and then step 1 is performed.

The N-type ion implantation area of the photodiode defined in step 1 and the N-type ion implantation area enlarged by means of the photoresist dry etching descum process in step 2 are both located at the N well 3.

The first photodiode N-type ion implantation and the second photodiode N-type ion implantation are both performed in the N well 3.

In an example, the photoresist dry etching descum process is performed in step 2 to enlarge the N-type ion implantation area to 120%-180% of the N-type ion implantation area defined in step 1.

In an example, the depth of the first photodiode N-type ion implantation is 0.15 μm to 0.4 μm;

The depth of the second photodiode N-type ion implantation is 0.1 μm to 0.2 μm.

The depth of the second photodiode P-type ion implantation is less than 0.1 μm.

In an example, after step 5, the method further includes:

step 6, removing the photoresist, and performing second photodiode P-type ion implantation by using the polysilicon gate 6 and the spacer 7 thereof as masks.

The depth of the second photodiode P-type ion implantation is less than the depth of the first photodiode P-type ion implantation.

In an example, the CMOS pixel readout circuit of the CMOS image sensor is a 3T-type pixel circuit, and the polysilicon gate 6 of a reset transistor covers a joint between the N well 3 and the P well 2.

In an example, the CMOS pixel readout circuit of the CMOS image sensor is a 4T-type pixel circuit, and the polysilicon gate 6 of a transfer transistor covers a joint between the N well 3 and the P well 2.

In the method for preparing a pixel cell of a CMOS image sensor provided by the present application, process optimization and adjustment for multiple times of ion implantation in a pixel area of the CMOS image sensor are carried out. That is, the photodiode N-type ion implantation is performed before the formation of the polysilicon gate 6 of each MOS transistor of the CMOS pixel readout circuit, the photoresist open area is enlarged by means of the photoresist dry etching descum process such that the N-type ion implantation area is enlarged, and the second photodiode N-type ion implantation is performed on the basis of the photoresist dry etching descum process, so as to achieve two times of photodiode N-type ion implantation using the same mask, with different depths and different pattern sizes, thereby forming an N-type area 4 of the photodiode that tapers to the bottom and undergoes a gradient change, which facilitates charge storage and transfer processes, saving a mask layer, reducing photolithography steps, reducing the cost of manufacturing the CMOS image sensor, shortening the cycle of manufacturing the CMOS image sensor, and improving the competitiveness of manufacturing a CMOS image sensor chip. Moreover, the size of the photoresist open area is changed by means of the photoresist dry etching descum process, so as to achieve fine adjustment to the ion implantation area with patterns of different sizes, thereby satisfying device performance requirements. In addition, for a P-type lightly doped area 5 above the N-type area 4 of the photodiode, first photodiode P-type ion implantation thereof uses the polysilicon gate 6 as a mask, further saving the mask and reducing the photolithography steps.

BRIEF DESCRIPTION OF THE DRAWINGS

In order to illustrate the technical solutions of the present application more clearly, the drawings required in the present application are briefly described below. Obviously, the drawings described below are only some embodiments of the present application. Other drawings can be obtained by those of ordinary skill in the art from these drawings without creative effort.

DETAILED DESCRIPTION OF THE DISCLOSURE

The technical solutions of the present application are clearly and completely described below with reference to the drawings. Obviously, the described embodiments are some of the embodiments of the present application, rather than all of the embodiments. Based on the embodiments of the present application, all other embodiments obtained by those of ordinary skill in the art without creative effort shall fall within the scope of protection of the present application.

Embodiment 1

Figure 1:
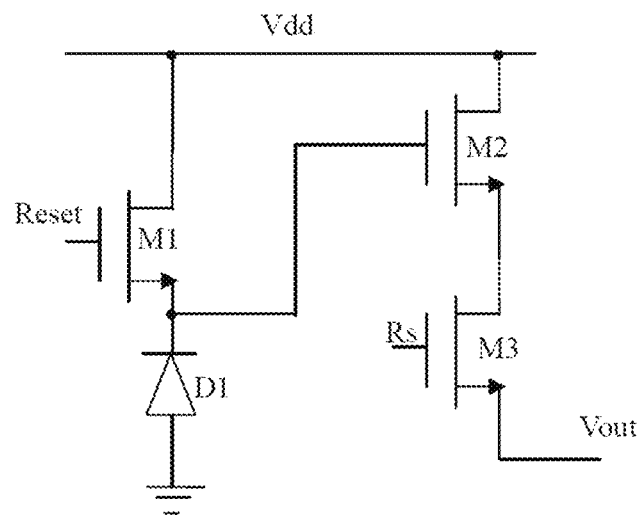
FIG. 1 is a schematic diagram of an equivalent circuit of a pixel cell circuit of a 3T-type CMOS image sensor.
Figure 2:
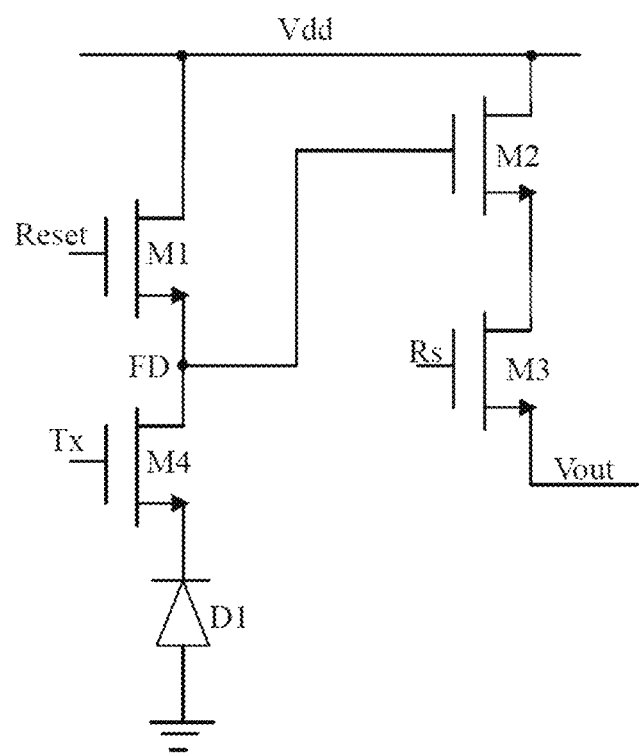
FIG. 2 is a schematic diagram of an equivalent circuit of a pixel cell circuit of a 4T-type CMOS image sensor.
Figure 3:
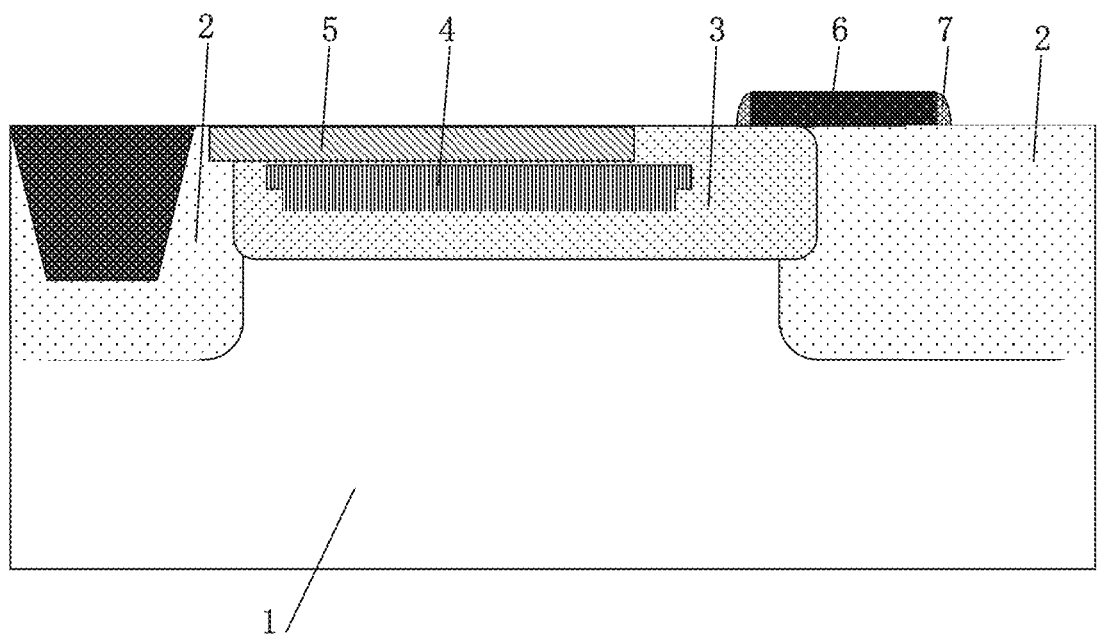
FIG. 3 is a sectional view of a pixel area of a CIS device.
Figure 4:
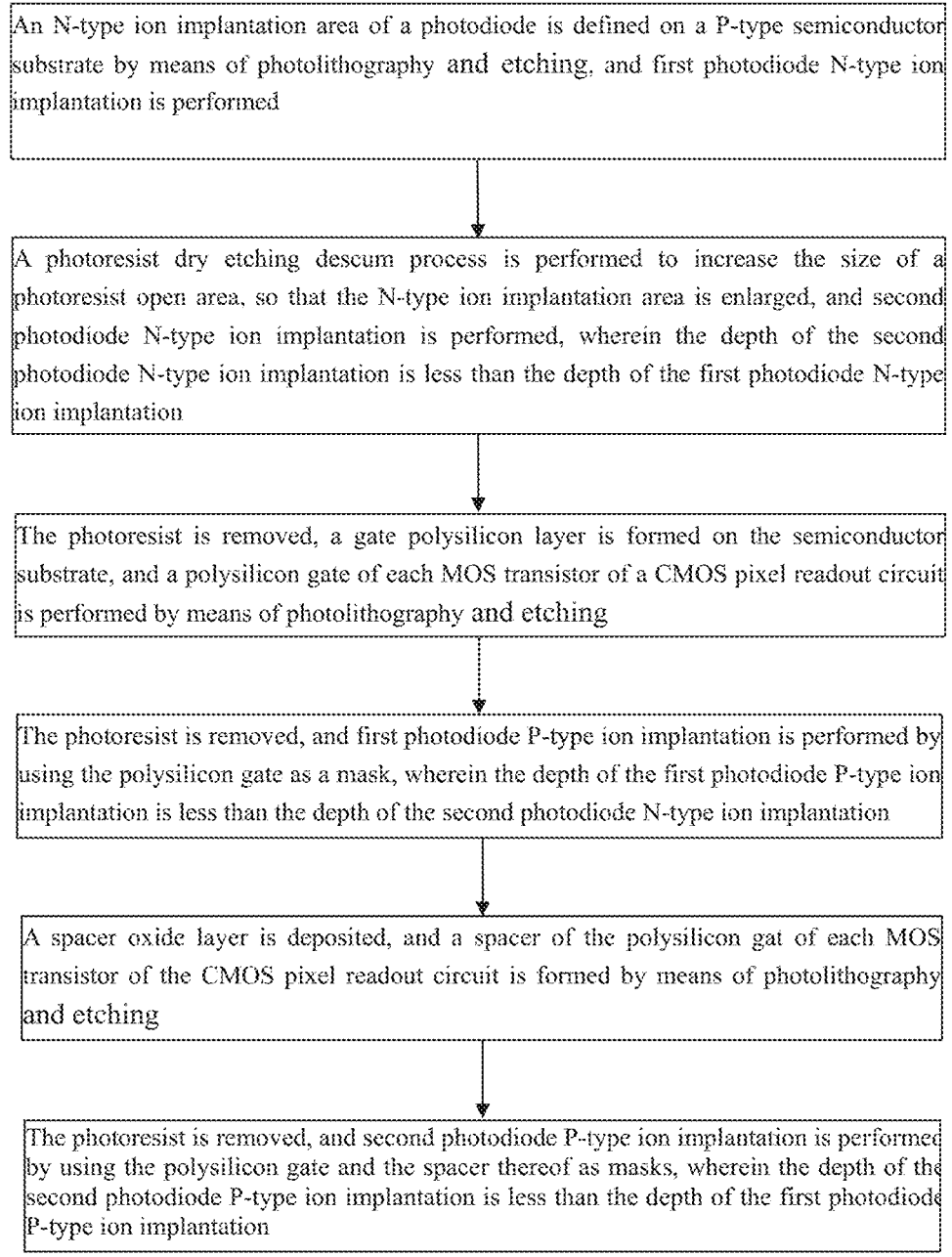
FIG. 4 is a flowchart of an embodiment of a method for preparing a pixel cell of a CMOS image sensor according to the present application.

Referring to FIG. 4, a method for preparing a pixel cell of a CMOS image sensor includes the following steps:

Step 1. An N-type ion implantation area of a photodiode is defined on a P-type semiconductor substrate 1 by means of photolithography and etching, and first photodiode N-type ion implantation is performed.

Step 2. A photoresist dry etching descum process is performed to increase the size of a photoresist open area, so that the N-type ion implantation area is enlarged, and second photodiode N-type ion implantation is performed, wherein the depth of the second photodiode N-type ion implantation is less than the depth of the first photodiode N-type ion implantation.

Step 3. The photoresist is removed, a gate polysilicon layer is formed on the semiconductor substrate, and a polysilicon gate 6 of each MOS transistor of a CMOS pixel readout circuit is performed by means of photolithography and etching.

Step 4. The photoresist is removed, and first photodiode P-type ion implantation is performed by using the polysilicon gate 6 as a mask, wherein the depth of the first photodiode P-type ion implantation is less than the depth of the second photodiode N-type ion implantation.

Step 5. A spacer oxide layer is deposited, and a spacer 7 of the polysilicon gate 6 of each MOS transistor of the CMOS pixel readout circuit is formed by means of photolithography and etching.

In the method for preparing a pixel cell of a CMOS image sensor of Embodiment 1, process optimization and adjustment for multiple times of ion implantation in a pixel area of the CMOS image sensor are carried out. That is, the photodiode N-type ion implantation is performed before the formation of the polysilicon gate 6 of each MOS transistor of the CMOS pixel readout circuit, the photoresist open area is enlarged by means of the photoresist dry etching descum process such that the N-type ion implantation area is enlarged, and the second photodiode N-type ion implantation is performed on the basis of the photoresist dry etching descum process, so as to achieve two times of photodiode N-type ion implantation using the same mask, with different depths and different pattern sizes, thereby forming an N-type area 4 of the photodiode that tapers to the bottom and undergoes a gradient change, which facilitates charge storage and transfer processes, saving a mask layer, reducing photolithography steps, reducing the cost of manufacturing the CMOS image sensor, shortening the cycle of manufacturing the CMOS image sensor, and improving the competitiveness of manufacturing a CMOS image sensor chip. Moreover, the size of the photoresist open area is changed by means of the photoresist dry etching descum process, so as to achieve fine adjustment to the ion implantation area with patterns of different sizes, thereby satisfying device performance requirements. In addition, for a P-type lightly doped area 5 above the N-type area 4 of the photodiode, first photodiode P-type ion implantation thereof uses the polysilicon gate 6 as a mask, further saving the mask and reducing the photolithography steps.

Embodiment 2

Based on the method for preparing a pixel cell of a CMOS image sensor of Embodiment 1, firstly, a plurality of P wells 2 are formed on the P-type semiconductor substrate 1 and an N well 3 connecting two adjacent P wells 2 is formed, and then step 1 is performed.

The N-type ion implantation area of the photodiode defined in step 1 and the N-type ion implantation area enlarged by means of the photoresist dry etching descum process in step 2 are both located at the N well 3.

The first photodiode N-type ion implantation and the second photodiode N-type ion implantation are both performed in the N well 3.

In an example, the photoresist dry etching descum process is performed in step 2 to enlarge the N-type ion implantation area to 120%-180% of the N-type ion implantation area defined in step 1.

Embodiment 3

Based on the method for preparing a pixel cell of a CMOS image sensor of Embodiment 1, the depth of the first photodiode N-type ion implantation is 0.15 μm to 0.4 μm.

The depth of the second photodiode N-type ion implantation is 0.1 μm to 0.2 μm.

The depth of the second photodiode P-type ion implantation is less than 0.1 μm.

Embodiment 4

Based on the method for preparing a pixel cell of a CMOS image sensor of Embodiment 1, after step 5, the method further includes:

Step 6. The photoresist is removed, and second photodiode P-type ion implantation is performed by using the polysilicon gate 6 and the spacer 7 thereof as masks.

The depth of the second photodiode P-type ion implantation is less than the depth of the first photodiode P-type ion implantation.

In the method for preparing a pixel cell of a CMOS image sensor of Embodiment 4, after the spacer 7 of the polysilicon gate 6 is formed, the second photodiode P-type ion implantation is performed by using the polysilicon gate 6 and the spacer 7 as masks. The first photodiode P-type ion implantation without a mask is flexibly compensated in the case of adding no mask, so as to avoid possible device performance degradation caused by the first photodiode P-type ion implantation without a mask, thereby satisfying high performance requirements of the pixel cell of the CMOS image sensor on the basis of saving a mask layer and reducing the cost, achieving cost reduction and standard performance at the same time.

Embodiment 5

Based on the method for preparing a pixel cell of a CMOS image sensor of Embodiment 1, the CMOS pixel readout circuit of the CMOS image sensor is a 3T-type pixel circuit, and the polysilicon gate 6 of a reset transistor covers a joint between the N well 3 and the P well 2. Junction Embodiment 6

Based on the method for preparing a pixel cell of a CMOS image sensor of Embodiment 1, the CMOS pixel readout circuit of the CMOS image sensor is a 4T-type pixel circuit, and the polysilicon gate 6 of a transfer transistor (also referred to as pass transistor) covers a joint between the N well 3 and the P well 2.

Some of the embodiments of the present application are described above, but are not intended to limit the present application. Any modifications, equivalent replacements, improvements, etc. made within the spirit and principles of the present application shall be included in the scope of protection of the present application.

What is claimed is:

1. A method for preparing a pixel cell of a CMOS image sensor, comprising the following steps:
    step 1, defining an N-type ion implantation area of a photodiode on a P-type semiconductor substrate by means of photolithography and etching, and performing first photodiode N-type ion implantation;
    step 2, performing a photoresist dry etching descum process to increase a size of a photoresist open area, so that the N-type ion implantation area is enlarged, and performing second photodiode N-type ion implantation, wherein a depth of the second photodiode N-type ion implantation is less than the depth of the first photodiode N-type ion implantation;
    step 3, removing the photoresist, forming a gate polysilicon layer on the semiconductor substrate, and forming a polysilicon gate of each MOS transistor of a CMOS pixel readout circuit by means of photolithography and etching;
    step 4, removing the photoresist, and performing first photodiode P-type ion implantation by using the polysilicon gate as a mask, wherein the depth of the first photodiode P-type ion implantation is less than the depth of the second photodiode N-type ion implantation; and
    step 5, depositing a spacer oxide layer, and forming a spacer of the polysilicon gate of each MOS transistor of the CMOS pixel readout circuit by means of photolithography and etching.

2. The method for preparing the pixel cell of the CMOS image sensor according to claim 1, wherein
    firstly, a plurality of P wells are formed on the P-type semiconductor substrate and an N well connecting two adjacent P wells is formed, and then step 1 is performed;
    the N-type ion implantation area of the photodiode defined in step 1 and the N-type ion implantation area enlarged by means of the photoresist dry etching descum process in step 2 are both located at the N well; and
    the first photodiode N-type ion implantation and the second photodiode N-type ion implantation are both performed in the N well.

3. The method for preparing the pixel cell of the CMOS image sensor according to claim 1, wherein
    the photoresist dry etching descum process is performed in step 2 to enlarge the N-type ion implantation area to 120%-180% of the N-type ion implantation area defined in step 1.

4. The method for preparing the pixel cell of the CMOS image sensor according to claim 1, wherein
    the depth of the first photodiode N-type ion implantation is 0.15 μm to 0.4 μm;
    the depth of the second photodiode N-type ion implantation is 0.1 μm to 0.2 μm; and
    the depth of the second photodiode P-type ion implantation is less than 0.1 μm.

5. The method for preparing the pixel cell of the CMOS image sensor according to claim 1, after step 5, further comprising:
    step 6, removing the photoresist, and performing second photodiode P-type ion implantation by using the polysilicon gate and the spacer thereof as masks, wherein
    the depth of the second photodiode P-type ion implantation is less than the depth of the first photodiode P-type ion implantation.

6. The method for preparing the pixel cell of the CMOS image sensor according to claim 1, wherein
    the CMOS pixel readout circuit of the CMOS image sensor is a 3T-type pixel circuit, and the polysilicon gate of a reset transistor covers a joint between the N well and the P well.

7. The method for preparing the pixel cell of the CMOS image sensor according to claim 1, wherein
    the CMOS pixel readout circuit of the CMOS image sensor is a 4T-type pixel circuit, and the polysilicon gate of a transfer transistor covers a joint between the N well and the P well.

* * * * *